US009620531B2

(12) United States Patent
Jin et al.

(10) Patent No.: US 9,620,531 B2
(45) Date of Patent: Apr. 11, 2017

(54) TFT ARRAY SUBSTRATE, DISPLAY PANEL AND DISPLAY DEVICE

(71) Applicants: Shanghai AVIC Optoelectronics Co., Ltd., Shanghai (CN); Tianma Micro-Electronics Co., Ltd., Shenzhen (CN)

(72) Inventors: Huijun Jin, Shanghai (CN); Yansong Li, Shanghai (CN); Miaomiao Wang, Shanghai (CN)

(73) Assignees: SHANGHAI AVIC OPTOELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/712,620

(22) Filed: May 14, 2015

(65) Prior Publication Data

US 2016/0118409 A1    Apr. 28, 2016

(30) Foreign Application Priority Data

Oct. 28, 2014 (CN) .......................... 2014 1 0587276

(51) Int. Cl.
*H01L 27/01* (2006.01)
*H01L 27/12* (2006.01)
(Continued)

(52) U.S. Cl.
CPC ......... *H01L 27/124* (2013.01); *G09G 3/3677* (2013.01); *H01L 27/1214* (2013.01);
(Continued)

(58) Field of Classification Search
CPC ............... H01L 27/124; H01L 27/1248; H01L 29/78669; H01L 27/1255; H01L 27/1222;
(Continued)

(56) References Cited

U.S. PATENT DOCUMENTS 6,541,294 B1 * 4/2003 Yamazaki ......... H01L 21/32136
257/E21.311
9,147,721 B2 * 9/2015 Hong .................... H01L 51/525
(Continued)

FOREIGN PATENT DOCUMENTS

CN      101978504 A     2/2011
CN      202975549       6/2013
(Continued)

*Primary Examiner* — Shouxiang Hu
(74) *Attorney, Agent, or Firm* — Anova Law Group, PLLC

(57) ABSTRACT

A TFT array substrate is disclosed. The TFT array substrate includes a base, a display region disposed on the base, and a gate drive circuit region disposed on the base. The display region includes a plurality of data lines extending along a first direction, and a plurality of scan lines extending along a second direction, the scan lines intersecting and electrically insulated from the data lines. In addition, the gate drive circuit region includes at least one first capacitor, and a plurality of TFTs which are separated from each other to form a margin region between the TFTs, where the first capacitor is disposed in the margin region.

20 Claims, 11 Drawing Sheets

(51) Int. Cl.
*H01L 29/04* (2006.01)
*H01L 29/786* (2006.01)
*H01L 27/32* (2006.01)
*G09G 3/36* (2006.01)

(52) U.S. Cl.
CPC ...... *H01L 27/1222* (2013.01); *H01L 27/1248* (2013.01); *H01L 27/1255* (2013.01); *H01L 27/3244* (2013.01); *H01L 27/3276* (2013.01); *H01L 29/78669* (2013.01); *G09G 2300/0408* (2013.01)

(58) Field of Classification Search
CPC ............. H01L 27/1214; H01L 27/3244; H01L 29/4908; H01L 27/3276; H01L 27/016; H01L 27/13
USPC ............................................ 257/72, 59, 532
See application file for complete search history.

(56) References Cited

U.S. PATENT DOCUMENTS

| | | | |
|---|---|---|---|
| 2009/0017568 A1* | 1/2009 | Kakehata | H01L 27/1214 438/29 |
| 2012/0320008 A1 | 12/2012 | Takahashi et al. | |
| 2014/0061606 A1* | 3/2014 | Kim | H01L 23/48 257/40 |
| 2014/0239270 A1* | 8/2014 | Ko | H01L 27/1255 257/40 |
| 2015/0070616 A1* | 3/2015 | Ogasawara | G02F 1/1339 349/43 |

FOREIGN PATENT DOCUMENTS

| | | |
|---|---|---|
| CN | 203434152 U | 2/2014 |
| CN | 104022122 A | 9/2014 |
| JP | 5009373 B2 | 8/2012 |
| WO | 2013157285 A1 | 10/2013 |

* cited by examiner

TFT ARRAY SUBSTRATE, DISPLAY PANEL AND DISPLAY DEVICE

CROSS-REFERENCES TO RELATED APPLICATIONS

This application claims the benefit of priority to Chinese Patent Application No. 201410587276.4, filed with the Chinese Patent Office on Oct. 28, 2014 and entitled "TFT ARRAY SUBSTRATE, DISPLAY PANEL AND DISPLAY DEVICE", the content of which is incorporated herein by reference in its entirety.

BACKGROUND OF THE INVENTION

Currently, in order to implement a thin and light display product, a Gate Driver on Array (GOA) technology, with which progressive (or line-by-line) scan drive of a display panel is achieved by integrating gate switching circuitry in an array substrate of the display panel, is typically used in designing a scan drive circuit of the display panel, in place of the existing design of a separated gate drive Integrated Circuit (IC). An amorphous silicon gate drive circuit on the array substrate is generally disposed on one or two sides of a display region and occupies a significant area of the frame region of the display panel. However, it is currently required to reduce the area of the frame region as much as possible in the dominant design of the display product.

As shown in FIG. 1 which is a schematic diagram showing an arrangement of various components of a gate drive circuit 1000, the gate drive circuit 1000 generally includes an ASG (a-Si Shift Register) Bus wire 111, an ASG capacitor 112 and an ASG Thin-Film Transistor (TFT) 113. In the related art, the ASG capacitor 112 includes two electrode plates, which are typically formed by a gate metal layer 112b and a source-drain metal layer 112a. However, the gate metal layer 112b and the source-drain metal layer 112a are usually made of opaque material, therefore, the ASG capacitor 112 is opaque and may affect a light transmittance of the frame of the display panel, so that in solidifying a seal agent applied to the frame through Ultraviolet (UV) light irradiation, the solidification of the seal agent will not be good enough because the ASG capacitor region is opaque. As shown in FIG. 2, in order to solve the above problems, the ASG capacitor 112 is hollowed out in the related art, i.e., elongated openings are formed in the gate metal layer 112b and the source-drain metal layer 112a, such that lights can pass through the ASG capacitor 112 and hence the light transmittance of the ASG capacitor 112 is increased. However, facing areas of the two electrode plates of the ASG capacitor 112 are required to be enlarged so as to ensure sufficient capacitance of the ASG capacitor 112, which results in that the area of the gate drive circuit 1000 is excessively occupied and it is difficult to implement a narrow frame. Alternatively, an Indium Tin Oxide (ITO) layer on the array substrate is configured to also function as the two electrode plates of the ASG capacitor, in this case, although the ITO layer is made of transparent conductive material so as to enhance the light transmittance of the display panel, the problem of poor solidification of the seal agent is still existing due to the presence of the ITO layer.

BRIEF SUMMARY OF THE INVENTION

One inventive aspect is a TFT array substrate. The TFT array substrate includes a base, a display region disposed on the base, and a gate drive circuit region disposed on the base. The display region includes a plurality of data lines extending along a first direction, and a plurality of scan lines extending along a second direction, the scan lines intersecting and electrically insulated from the data lines. In addition, the gate drive circuit region includes at least one first capacitor, and a plurality of TFTs which are separated from each other to form a margin region between the TFTs, where the first capacitor is disposed in the margin region.

Another inventive aspect is a display panel including a TFT array substrate, a color filter substrate, and a display medium layer disposed between the TFT array substrate and the color filter substrate. The TFT array substrate includes a base, a display region disposed on the base, and a gate drive circuit region disposed on the base. The display region includes a plurality of data lines extending along a first direction, and a plurality of scan lines extending along a second direction, the scan lines intersecting and electrically insulated from the data lines. In addition, the gate drive circuit region includes at least one first capacitor, and a plurality of TFTs which are separated from each other to form a margin region between the TFTs, where the first capacitor is disposed in the margin region.

Another inventive aspect is a display device including a display panel which includes a display panel including a TFT array substrate, a color filter substrate, and a display medium layer disposed between the TFT array substrate and the color filter substrate. The TFT array substrate includes a base, a display region disposed on the base, and a gate drive circuit region disposed on the base. The display region includes a plurality of data lines extending along a first direction, and a plurality of scan lines extending along a second direction, the scan lines intersecting and electrically insulated from the data lines. In addition, the gate drive circuit region includes at least one first capacitor, and a plurality of TFTs which are separated from each other to form a margin region between the TFTs, where the first capacitor is disposed in the margin region.

BRIEF DESCRIPTION OF THE DRAWINGS

In order to describe the technical solutions of the embodiments of the present disclosure more clearly, the accompanying drawings used in the description of the embodiments will be briefly introduced below. Apparently, the drawings for the description below illustrate merely some embodiments of the disclosure, and other figures can be derived from the accompanying drawings by those ordinary skilled in the art without creative work.

DETAILED DESCRIPTION OF THE PREFERRED EMBODIMENTS

The technical solutions in embodiments of the present disclosure will be clearly and thoroughly described with reference to the accompanying drawings illustrating the embodiments of the present disclosure. Apparently, the described embodiments are merely a part rather than all of embodiments of the present disclosure. Any other embodiment obtained by persons of ordinary skill in the art based on the described embodiments of the present disclosure without creative work shall fall in the protection scope of the present disclosure.

Shapes and sizes of the various components as shown in the accompanying drawings are not necessarily in their actual scales, but are merely intended to illustrate the content of the present disclosure.

Figure 1:
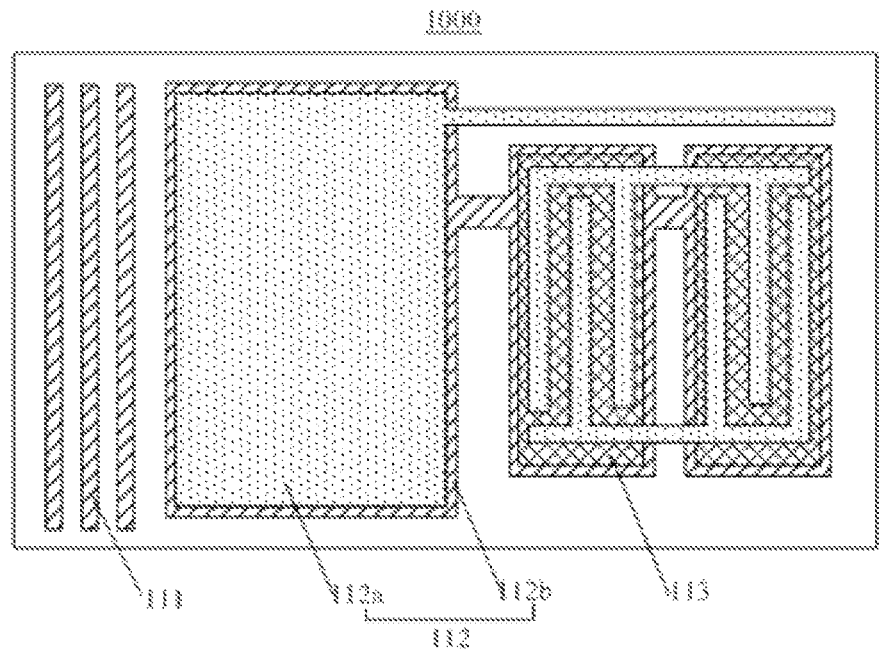
FIG. 1 is a schematic diagram showing a gate drive circuit region disclosed in the related art.
Figure 2:
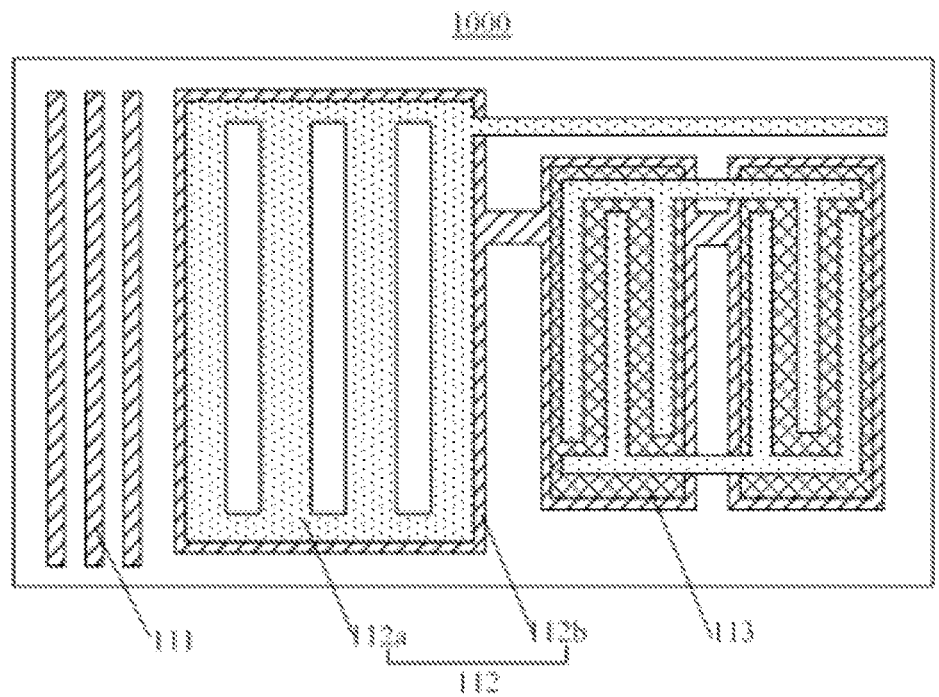
FIG. 2 is a schematic diagram showing another gate drive circuit region disclosed in the related art.
Figure 3:
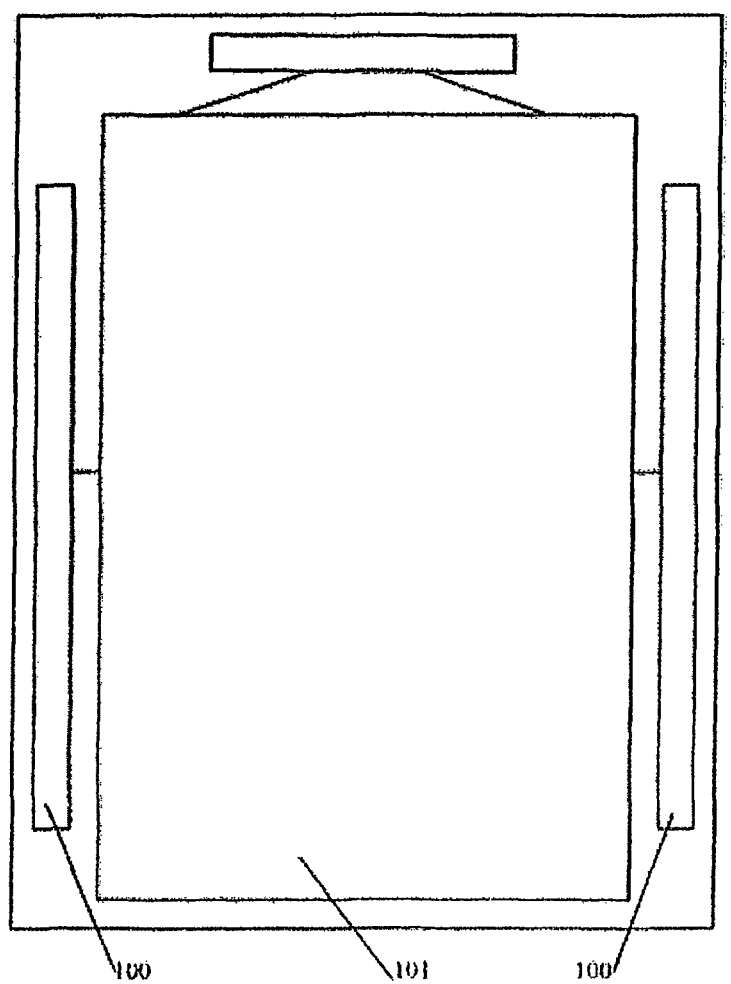
FIG. 3 is a schematic diagram showing a TFT array substrate according to an embodiment of the present disclosure.
Figure 3A:
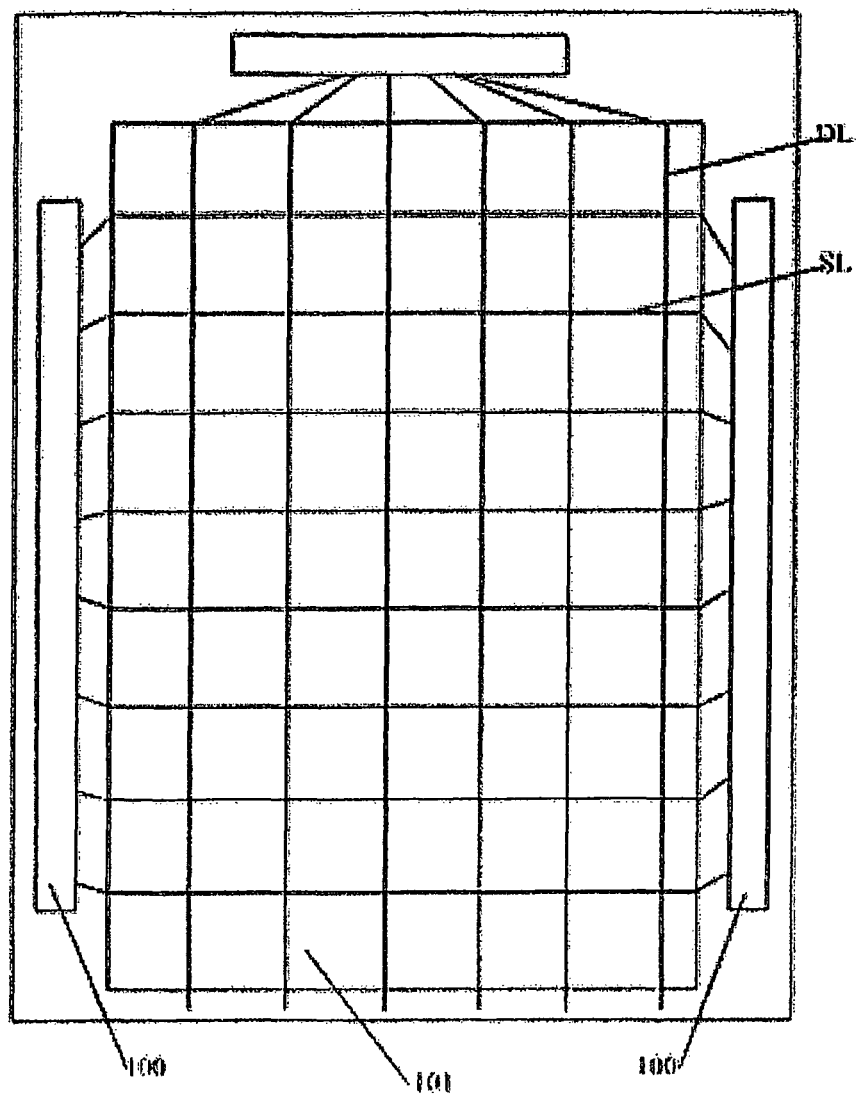
FIG. 3A is another schematic diagram showing a TFT array substrate according to an embodiment of the present disclosure.

As shown in FIGS. 3 to 6, the present disclosure discloses a TFT array substrate including a base, a display region 101 is disposed on the base, and gate drive circuit regions 100 are disposed in a peripheral region around the display region 101, As shown in FIG. 3, the gate drive circuit regions 100 are disposed in the peripheral region on two sides of the display region 101, alternatively, the gate drive circuit regions 100 may be disposed in the peripheral region merely on one side of the display region 101 according to the specific design of the display panel, which is not limited herein. The display region 101 includes a plurality of data lines DL (as shown in FIG. 3A) extending along a first direction and a plurality of scan lines SL (as shown in FIG. 3A) extending along a second direction, where the scan lines are intersected with and electrically insulated from the data lines. The data lines are formed by patterning a data line metal layer, and the scan lines are formed by patterning a gate metal layer. In general, the TFT array substrate is usually formed in a bottom gate structure, i.e., a gate electrode of the TFT that is formed by the gate metal layer is in a bottom metal layer in the array substrate, and a source electrode and a drain electrode of the TFT that are formed by the data metal layer are disposed above the gate electrode. The TFT is illustratively described to have the bottom gate structure in the present embodiment, but is not limited thereto.

Figure 4:
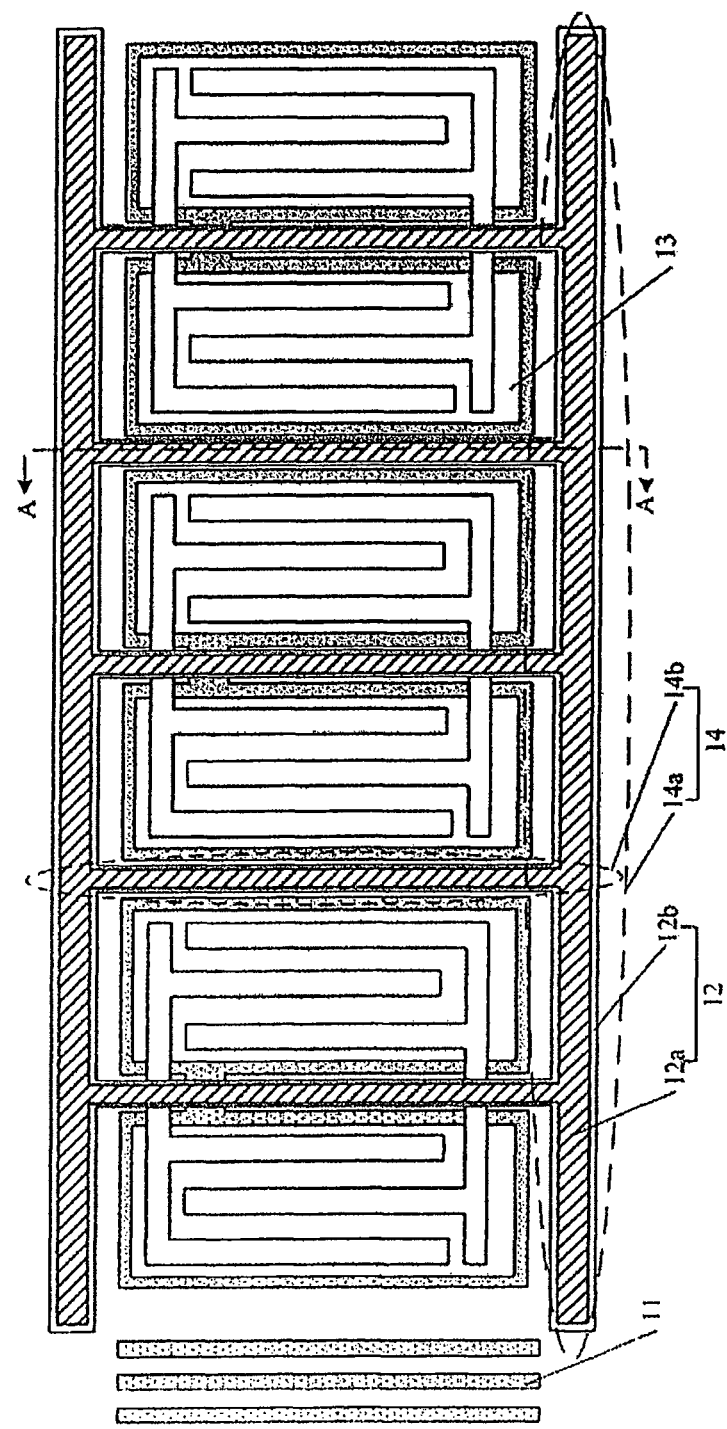
FIG. 4 is a schematic diagram showing a gate drive circuit region according to an embodiment of the present disclosure.
Figure 5:
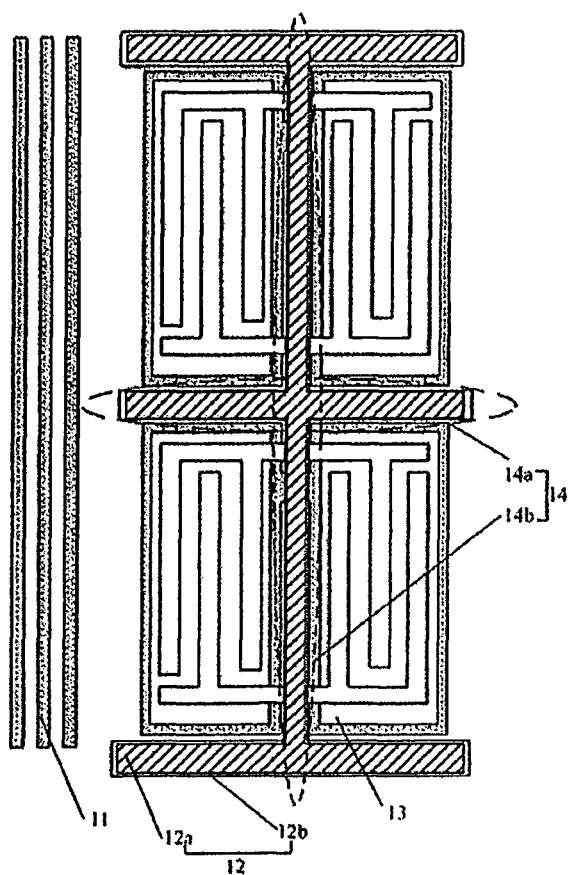
FIG. 5 is a schematic diagram showing another gate drive circuit region according to an embodiment of the present disclosure.
Figure 6:
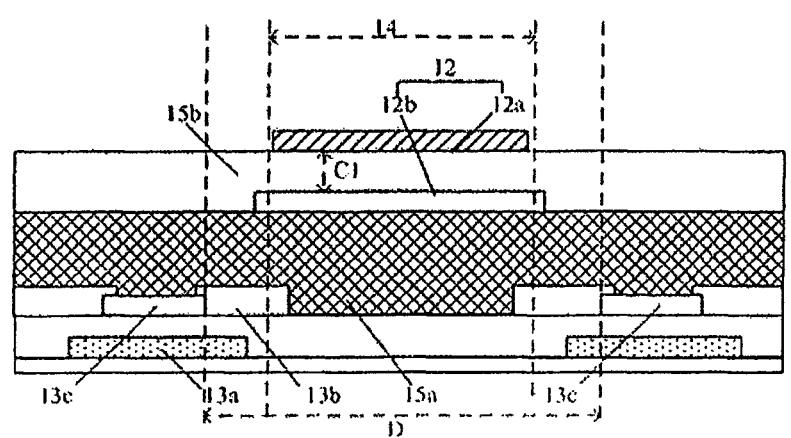
FIG. 6 is a sectional view taken along line A-A in FIG. 4.

FIGS. 4 to 5 are enlarged schematic diagrams showing the gate drive circuit region 100 in FIG. 3, and FIG. 6 is a sectional view taken along line A-A in FIG. 4. Specifically, the gate drive circuit region 100 at least includes a first capacitor 12, a plurality of TFTs 13 and common BUS wires 11. The first capacitor 12 is usually a parallel plate capacitor, i.e., the first capacitor 12 includes at least two electrode plates, e.g. a first electrode plate 12b and a second electrode plate 12a disposed above and electrically insulated from the first electrode plate 12b, so as to form the parallel plate capacitor. As for the parallel plate capacitor, a distance between the two electrode plates is a critical parameter of the capacitance of the capacitor. Regarding the first capacitor 12 in the present embodiment, a distance between the first electrode plate 12b and the second electrode plate 12a can be adjusted by thickness of an insulating layer 15b within an allowable range in the art.

Still as shown in FIGS. 4 to 6, a plurality of the TFTs 13 separated from each other are generally included in the ASG drive circuit according to the structure of the ASG drive circuit so as to enable different controlling functions. In general, the TFT 13 mainly includes a gate electrode 13a, a source/drain electrode 13b (because the source electrode and the drain electrode are interchangeable, the source electrode and the drain electrode are not distinguished in the present disclosure and generally referred to as source/drain electrode) and a semiconductor layer 13c (which may be made of amorphous silicon material such as a-Si). A margin region 14 is formed because the TFTs 13 are spaced from each other. As shown in FIGS. 4 to 5, the plurality of TFTs 13 are disposed on the array substrate in such a way that a gap is formed between every two adjacent TFTs 13, as indicated by an ellipses shown in FIGS. 4 to 5. The gaps include approximately transverse gaps 14a formed between adjacent TFTs in the up-down direction and approximately vertical gaps 14b formed between adjacent TFTs in the left-right direction, thereby forming the margin region 14. Because a significant area of the gate drive circuit region 100 is occupied by the margin region 14 and becomes useless, an invalid area in the gate drive circuit region 100 is increased so that a total area of the gate drive circuit region 100 is also increased, i.e., an area of the gate drive circuit region 100, which is disposed in the peripheral region around the display region, is too large to implement a narrow frame. In order to solve this problem, a technical solution of disposing the first capacitor 12 in the margin region 14 is disclosed in the present disclosure, thereby saving an area of the gate drive circuit region 100 that is occupied by the first capacitor 12.

Further, the arrangement of the first capacitor 12 will be illustrated in detail below with reference to FIGS. 4 to 6.

As shown in FIGS. 4 to 5, because the margin region 14 includes a plurality of the approximately transverse gaps 14a (indicated by ellipses) and a plurality of the approximately vertical gaps 14b (indicated by ellipses), the first electrode plate 12b and the second electrode plate 12a of the first capacitor 12 are disposed at the approximately transverse gaps 14a and the approximately vertical gaps 14b and cover the gaps formed between the TFTs 13, and the arrangement of the electrode plates are basically the same as that of the gaps, i.e., the patterns of the first electrode plate 12b and the second electrode plate 12a are at least partially identical to the patterns of the gaps, such that the patterns of the first electrode plate 12b and the second electrode plate 12a correspond with or are similar to the patterns or shapes of the gaps. Of course, since the first capacitor 12 is formed as a parallel plate capacitor, a pattern of the first electrode plate 12b is basically the same as that of the second electrode plate 12a, but the size of the first electrode plate 12b may be different from that of the second electrode plate 12a, for example, the first electrode plate 12b, if disposed in a lower layer, may be larger than the second electrode plate 12a, alternatively, a width of the first electrode plate 12b may be larger than that of the second electrode plate 12a in the same cross-sectional view.

As shown in FIG. 6, when the first electrode plate 12b and the second electrode plate 12a of the first capacitor 12 are disposed in the margin region 14, it is noted that orthographic projections of the first electrode plate 12b and the second electrode plate 12a on the base cannot be overlapped with a semiconductor layer 13c of the TFT 13, i.e., the maximum widths of the first electrode plate 12b and the second electrode plate 12a are no more than a distance D between the semiconductor layers 13c of two adjacent TFTs 13, i.e., the maximum effective width of the first electrode plate 12b or the second electrode plate 12a is D, here the effective width refers to the width of a portion of the electrode plate that actually contribute to generate capacitance. If the first electrode plate 12b and the second electrode plate 12a have the maximum effective width, the first electrode 12 completely covers the margin region 14, and the shape of the first capacitor 12 is substantially identical to that of the gap and a width of the electrode plate is wider than a width of the gap. For example, a width of the gap between gate electrodes 13a of two adjacent TFTs 13 is usually larger than 10 μm, the distance D between two adjacent semiconductor layers 13c is usually about 20 μm, i.e. a width of the corresponding gap, and a length of each of the TFTs 13 is about 300 μm, i.e. a length of the corresponding gap, such that an area of a gap formed between every two adjacent TFTs in the left-right direction is about 6000 μm2. Considering an actual wiring region of one first capacitor 12 which is about 10000 μm2 and gaps between other adjacent TFTs 13, it may be possible to completely accommodate the first capacitor 12 into the gaps, thereby implementing that the first capacitor 12 is disposed in the margin region 14, so that a dedicated wiring region occupied by the first capacitor 12 in the related art is not necessary, and an area occupied by the gate drive circuit region 100 on the base is saved.

Further as shown in FIG. 6, a first dielectric layer 15a is disposed between the first electrode plate 12b and the data line metal layer (which form the source/drain electrode 13b), and the dielectric layer should be thick enough, so that if wires in the data line metal layer and the first electrode plate 12b, which are respectively disposed at an upper side and a lower side of the dielectric layer 15a, are overlapped with each other in the top view, coupling capacitance between the first electrode plate I12b and the data line metal layer is too small to affect normal operations of the gate drive circuit. In addition, the first dielectric layer 15a may be a passivation layer or an organic film, a thickness of which is in a range from 0.8 μm to 5 μm, preferably, from 1 μm to 3 μm.

Figure 7:
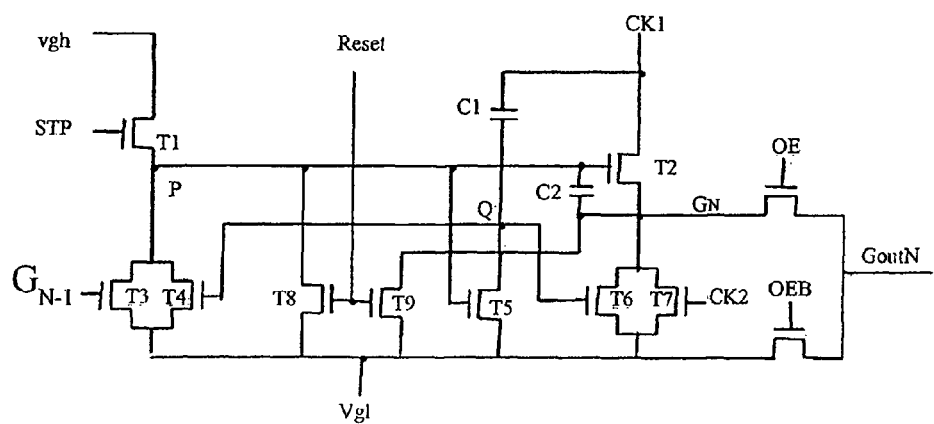
FIG. 7 is an equivalent circuit diagram of a gate drive circuit region according to an embodiment of the present disclosure.

As shown in FIGS. 7 to 10, the first electrode plate 12b and the second electrode plate 12a of the first capacitor 12 are respectively connected to a first potential V1 and a second potential V2 via through holes. Specifically, the present embodiment will be described with reference to a schematic view of a gate drive circuit as shown in FIG. 7, but it is not limited thereto. The gate drive circuit as shown in FIG. 7 includes nine TFTs and two capacitors to drive the display panel. For example, the potential connection relationship for a first capacitor C1, i.e., the first capacitor 12, is described as that one terminal of the first capacitor C1 is specifically electrically connected to a clock signal terminal CK1, and the other terminal of the first capacitor C1 is electrically connected to a pull-down signal point Q as shown in FIG. 7. As such, it can be considered that the first potential V1 is provided at the clock signal terminal CK1, and the second potential V2 is provided at the pull-down signal point Q. Because a voltage signal (i.e. the first potential V1) transmitted by the clock signal terminal CK1 comes from a common BUS wire 11 in the gate drive circuit and reaches the first electrode plate 12b through a first wire interconnection structure K1 via other signal lines, and the pull-down signal terminal Q is connected to both a gate electrode of a TFT and a source/drain electrode of another TFT, e.g., the pull-down signal point Q is connected to both the gate electrode of a TFT T6 and the source/drain electrode of another TFT T5 as shown in FIG. 7, therefore a second wire interconnection structure K2 is necessary for connecting the second potential V2 to the second electrode plate 12a.

Figure 8:
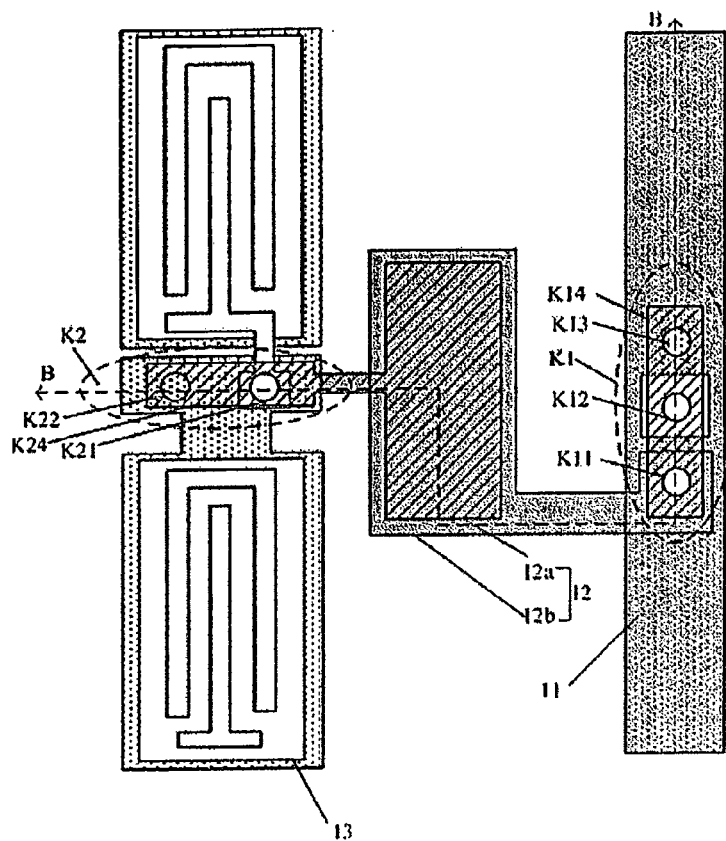
FIG. 8 is a schematic diagram showing a wire interconnection structure in the gate drive circuit region according to an embodiment of the present disclosure.
Figure 9:
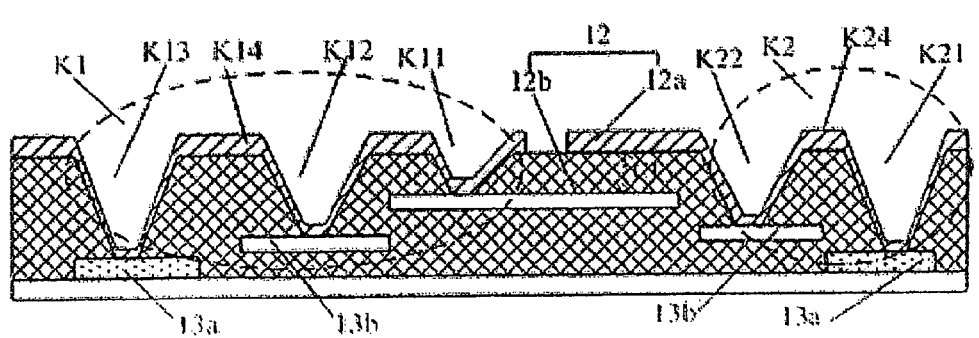
FIG. 9 is a sectional view taken along line B-B in FIG. 8.
Figure 10:
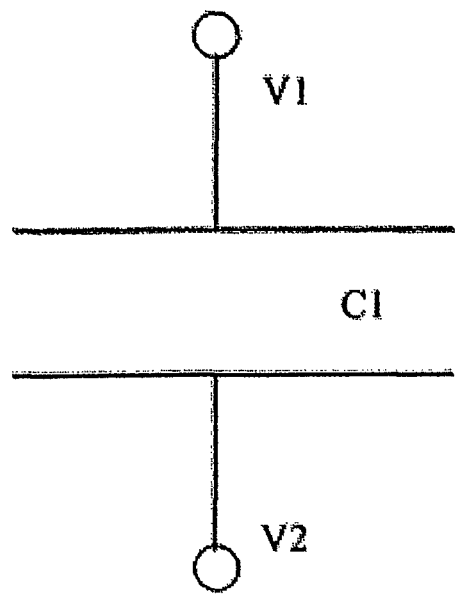
FIG. 10 is an equivalent circuit diagram of a first capacitor in FIG. 8.

Referring to FIGS. 8 to 10, where FIG. 8 is a schematic diagram showing a wire interconnection structure, FIG. 9 is a sectional view taken along a line B-B in FIG. 8 and FIG. 10 is an equivalent circuit diagram of the first capacitor 12, the wire interconnection structure will be described in detail as follows.

The first electrode plate 12b is connected to the first potential V1 through the first wire interconnection structure K1 (as shown in dashed ellipses in FIGS. 8 to 9), specifically, with the first wire interconnection structure K1, the first electrode plate 12b is exposed by a through hole K11 in the first wire interconnection structure K1, the data line metal layer 13b is exposed by a through hole K12, the scan line metal layer 13a is exposed by a through hole K13, and the first electrode plate 12b, the data line metal layer 13b and the scan line metal layer 13a are electrically connected to each other through a first connection layer K14, so that the first potential V1 on the common BUS wire 11 may be transmitted to the first electrode plate 12b. Of course, the common BUS wire 11 is disposed in the scan line metal layer 13b. In addition, the first connection layer K14 and the second electrode plate 12a may be disposed on the same layer and made of the same material, for example, transparent conductive material such as ITO, Indium Zinc Oxide (IZO), or metal material.

The second electrode plate 12a is connected to the second potential V2 through a second wire interconnection structure K2 (shown in dashed ellipses in FIGS. 8 to 9), particularly, with the first wire interconnection structure K2, the data line metal layer 13b is exposed by a through hole K22 in the first wire interconnection structure K2, the scan line metal layer 13a is exposed by a through hole K21, and the second electrode plate 12a, the data line metal layer 13b and the scan line metal layer 13a are electrically connected to each other through a second connection layer K24, so that the second potential V2 on the scan line metal layer 13a may be transmitted to the second electrode plate 12a. In addition, the second connection layer K24 and the second electrode plate 12a may be disposed on the same layer and made of the same material, for example, transparent conductive material such as ITO, Indium Zinc Oxide (IZO), or metal material.

The through holes described as above just represent an implementation of the present disclosure, and may be differently designed according to the designs of other components as long as the through holes allow the first potential V1 and the second potential V2 to be electrically connect to the first electrode plate 12b and the second electrode plate 12a, respectively, which is not described again here and not limited in the present embodiment.

Figure 6A:
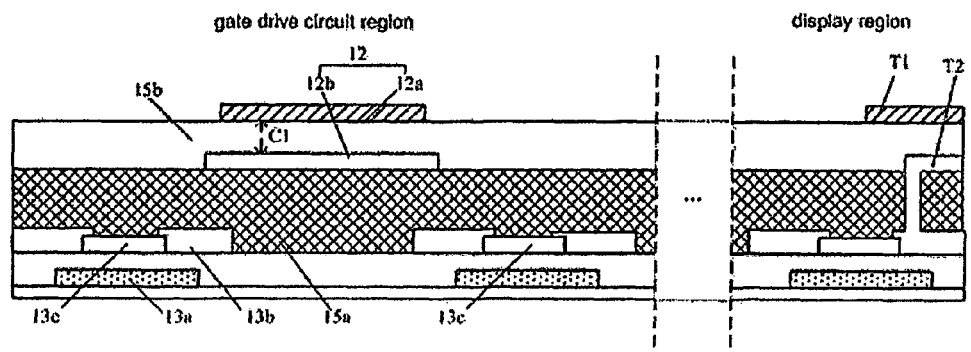
FIG. 6A is a schematic diagram showing another gate drive circuit region according to an embodiment of the present disclosure.

In an embodiment, the display region of the array substrate includes a first transparent conductive electrode T2 (as shown in FIG. 6A) which is a pixel electrode or a common electrode in the array substrate, and a second transparent conductive electrode T1 (as shown in FIG. 6A), which is a pixel electrode or a common electrode in the array substrate. The first electrode plate 12b may be disposed on the same layer and made of the same material as the first transparent conductive electrode T2, and the second electrode plate 12a may be disposed on the same layer and made of the same material as the second transparent conductive electrode T1. In such structure, the transparent conductive layer disposed on the array substrate may be used for forming both the transparent conductive electrodes in the display region and the capacitors in the gate drive circuit region 100, thereby simplifying the manufacture procedure of such structure and reducing the cost thereof. Of course, the first capacitor disposed in the gate drive circuit region 100 may be formed by other metal layers, which is not limited here.

In another embodiment of the present disclosure, the first capacitor further includes a third electrode plate disposed on and electrically insulated from the second electrode plate, and the third electrode plate is electrically connected to the first electrode plate, alternatively, the third electrode plate is electrically connected to the second electrode plate. The third electrode plate is described as being electrically connected to the first electrode plate, for example.

Figure 11:
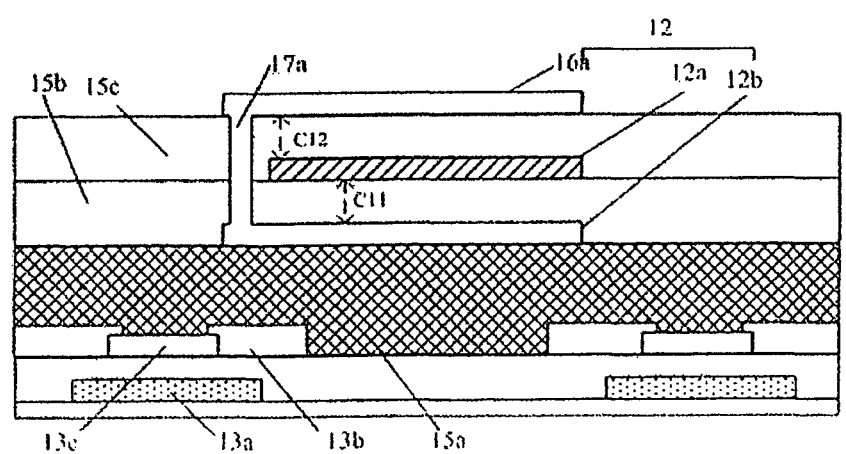
FIG. 11 is a schematic diagram showing a structure of a first capacitor according to an embodiment of the present disclosure.

As shown in FIG. 11, the first capacitor 12 further includes a third electrode plate 16a disposed above the second electrode plate 12a in addition to the first electrode plate 12b and the second electrode plate 12a, where the third electrode plate 16a is electrically insulated from the second electrode plate 12a through an insulating layer 15c. Additionally, considering that the first capacitor 12 is a parallel plate capacitor, a distance between the second electrode plate 12a and the third electrode plate 16a can be adjusted through the thickness of the insulating layer 15c as long as the distance is within an allowable range in the related art. Meanwhile, the third electrode plate 16a is electrically connected to the first electrode plate 12b through a through hole 17a, i.e., the potential of the third electrode plate 16a is equal to that of the first electrode plate 12b because both of the third electrode plate 16a and the first electrode plate 12b are electrically connected to the first potential V1, therefore no capacitor is formed by the third electrode plate 16a and the first electrode plate 12b.

Figure 14:
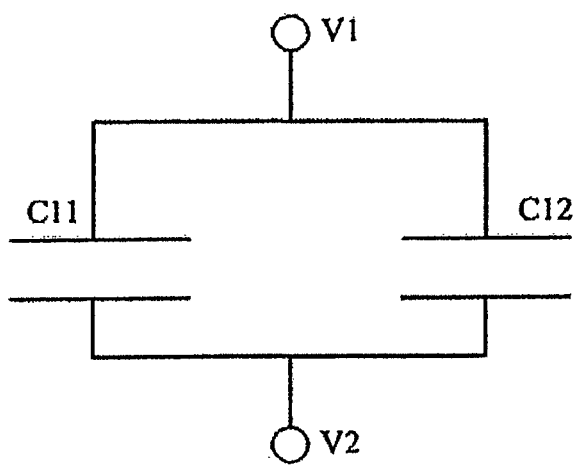
FIG. 14 is an equivalent circuit diagram of a first capacitor in FIG. 11.

As shown in FIG. 11 and FIG. 14, where FIG. 14 is an equivalent circuit diagram of the first capacitor 12 in FIG. 11, the first capacitor 12 includes three electrode plates, a capacitor C11 is formed by the first electrode plate 12b and the second electrode plate 12a arranged opposite to each other, and a capacitor C12 is formed by the second electrode plate 12a and the third electrode plate 16a arranged opposite to each other, that is, the first capacitor 12 is formed by the capacitor C11 and the capacitor C12 connected in parallel, as shown in FIG. 14. As such, the capacitance of the first capacitor 12 is increased, and areas of the electrode plates are reduced, thereby decreasing an area in the ASG capacitive region that is occupied by the first capacitor 12 and saving space.

Based on the above embodiments, another embodiment of the present disclosure is provided, where the first capacitor further includes a fourth electrode plate which is disposed above and electrically insulated from the third electrode plate, and the fourth electrode plate electrically is electrically connected to the first electrode plate, and the third electrode plate is electrically connected to the second electrode plate. Alternatively, the fourth electrode plate is electrically connected to the second electrode plate, and the third electrode plate is electrically connected to the first electrode plate.

Figure 12:
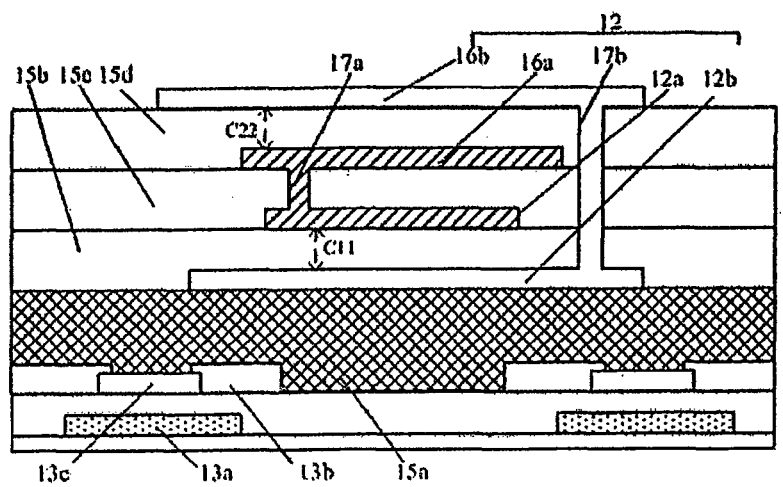
FIG. 12 is a schematic diagram showing another structure of a first capacitor according to an embodiment of the present disclosure.
Figure 15:
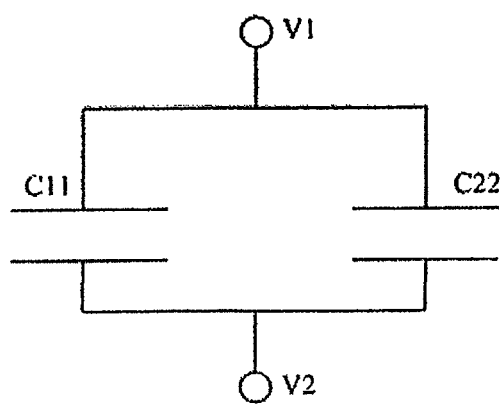
FIG. 15 is an equivalent circuit diagram of a first capacitor in FIG. 12.

The above embodiment will be described in detail below, as shown in FIG. 12 and FIG. 15, within the first capacitor 12, the fourth electrode plate 16b is electrically connected to the first electrode plate 12b, and the third electrode plate 16a is electrically connected to the second electrode plate 12a.

Specifically, in addition to the first electrode plate 12b, the second electrode plate 12a and the third electrode plate 16a, the first capacitor 12 further includes a fourth electrode plate 16b which is disposed above the third electrode plate 16a and electrically insulated from the third electrode plate 16a through an insulating layer 15d. In addition, the first capacitor 12 is a parallel plate capacitor, hence a distance between the third electrode plate 16a and the fourth electrode plate 16b may be adjusted through the thickness of the insulating layer 15d as long as the distance is within an allowable range in the related art. Meanwhile, the third electrode plate 16a is electrically connected to the second electrode plate 12a through a through hole 17a; and the fourth electrode plate 16b is electrically connected to the first electrode plate 12b through a through hole 17b. That is, the potential of the third electrode plate 16a is equal to that of the second electrode plate 12a, and both of the third electrode plate 16a and the second electrode plate 12a are electrically connected to the second potential V2, therefore no capacitor is formed by the third electrode plate 16a and the second electrode plate 12a. The potential of the fourth electrode plate 16b is equal to that of the first electrode plate 12b, both of the fourth electrode plate 16b and the first electrode plate 12b are electrically connected to the first potential V1, therefore no capacitor is formed by the fourth electrode plate 16b and the first electrode plate 12b.

As shown in FIG. 12 and FIG. 15, where FIG. 15 is an equivalent circuit diagram of a first capacitor in FIG. 11, the first capacitor 12 includes four electrode plates, a capacitor C11 is formed by the first electrode plate 12b and the second electrode plate 12a arranged opposite to each other, and a capacitor C12 is formed by the third electrode plate 16a and the fourth electrode plate 16b arranged opposite to each other, i.e., the first capacitor 12 is formed by the capacitor C11 and the capacitor C12 connected in parallel, as shown in FIG. 15. As such, the capacitance of the first capacitor 12 is increased and areas of the electrode plates are reduced, thereby decreasing an area of the ASG capacitive region that is occupied by the first capacitor 12 and saving space.

Figure 13:
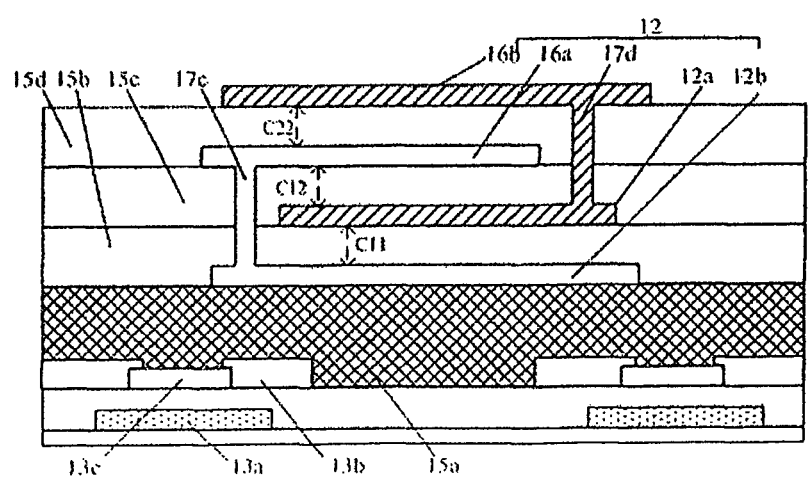
FIG. 13 is a schematic diagram showing yet another structure of a first capacitor according to an embodiment of the present disclosure.
Figure 16:
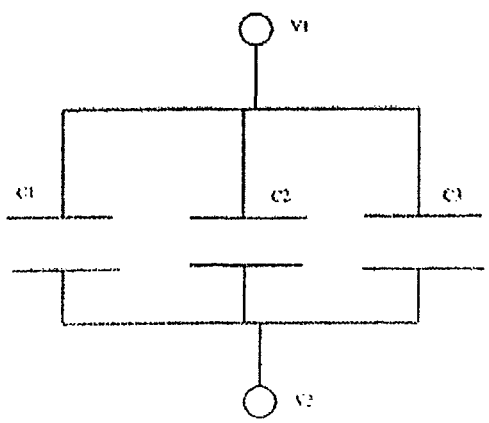
FIG. 16 is an equivalent circuit diagram of a first capacitor in FIG. 13.

In another embodiment, as shown in FIG. 13 and FIG. 16, within the first capacitor 12, the fourth electrode plate 16b is electrically connected to the second electrode plate 12a, and the third electrode plate 16a is electrically connected to the first electrode plate 12b.

Specifically, in addition to the first electrode plate 12b, the second electrode plate 12a and the third electrode plate 16a, the first capacitor 12 further includes a fourth electrode plate 16b which is disposed on the third electrode plate 16a and electrically insulated from the third electrode plate 16*a* through the insulating layer 15*d*. In addition, the first capacitor 12 is a parallel plate capacitor, hence a distance between the third electrode plate 16*a* and the fourth electrode plate 16*b* may be adjusted through the thickness of the insulating layer 15*d* as long as the distance is within an allowable range in the related art. Meanwhile, the third electrode plate 16*a* is electrically connected to the first electrode plate 12*b* through a through hole 17*c*, and the fourth electrode plate 16*b* is electrically connected to the second electrode plate 12*a* through a through hole 17*d*. That is, the potential of the third electrode plate 16*a* is equal to that of the first electrode plate 12*b*, and both of the third electrode plate 16*a* and the first electrode plate 12*b* are electrically connected to the first potential V1, therefore no capacitor is formed by the third electrode plate 16*a* and the first electrode plate 12*b*. The potential of the fourth electrode plate 16*b* is equal to that of the second electrode plate 12*a*, both of the fourth electrode plate 16*b* and the second electrode plate 12*a* are electrically connected to the first potential V2, therefore no capacitor is formed by the fourth electrode plate 16*b* and the second electrode plate 12*a*.

As shown in FIG. 13 and FIG. 16, where FIG. 16 is an equivalent circuit diagram of a first capacitor 12 in FIG. 11, the first capacitor 12 includes a fourth electrode plate, a capacitor C11 is formed by the first electrode plate 12*b* and the second electrode plate 12*a* arranged opposite to each other, a capacitor C22 is formed by the third electrode plate 16*a* and fourth electrode plate 16*b* arranged opposite to each other, and a capacitor C12 is formed by the third electrode plate 16*a* and the second electrode plate 12*a* arranged opposite to each other. That is, the first capacitor 12 is formed by the capacitor C11, the capacitor C12 and the capacitor C22 connected in parallel, as shown in FIG. 16. As such, the capacitance of the first capacitor 12 is increased and areas of the electrode plates are reduced, thereby decreasing an area in the gate drive circuit region that is occupied by the first capacitor 12 and saving space.

In addition, in the above embodiments, the first electrode plate, the second electrode plate, the third electrode plate and the fourth electrode plate are made of metal material or transparent metal oxide material. If the first electrode plate 12*b* and the second electrode plate 12*a* are made of the same material as and disposed in the same layer as the transparent conductive electrode in the display region, the third electrode plate 16*a* and the fourth electrode plate 16*b* may be made of transparent conductive material such as transparent metal oxide material like ITO, IZO and so on, thus these four electrode plates may be made of the same material, thereby simplifying processing steps. Of course, the third electrode plate 16*a* and the fourth electrode plate 16*b* may be made of metal material, which is not limited thereto.

Figure 17:
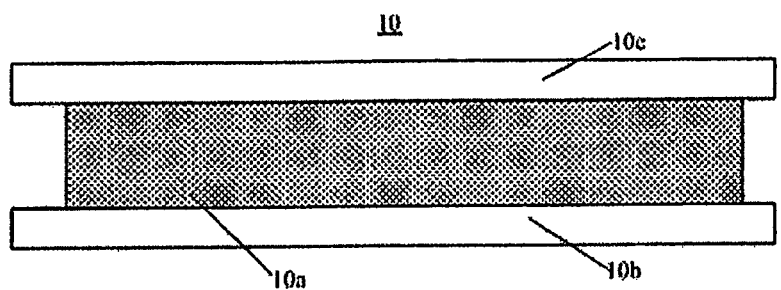
FIG. 17 is a schematic diagram showing a display panel according to an embodiment of the present disclosure.

As shown in FIG. 17, the present disclosure further discloses a display panel 10 including the TFT array substrate 10*b* as described above, a color filter substrate 10*c* and a display medium layer 10*a* disposed between the TFT array substrate 10*b* and the color filter substrate 10*c*.

Figure 18:
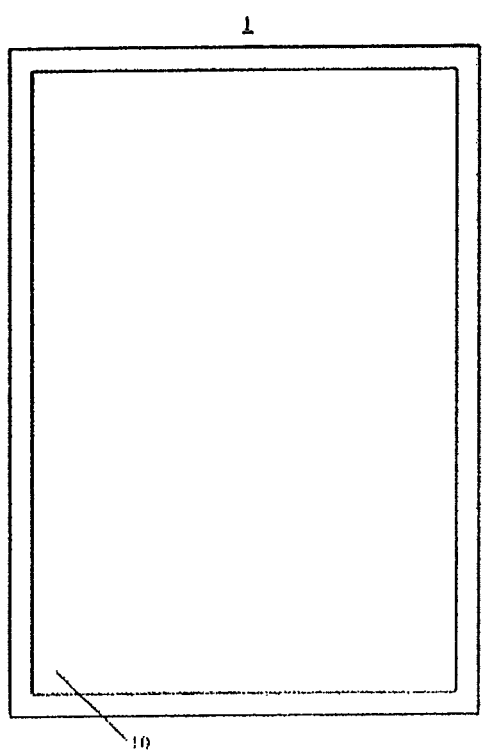
FIG. 18 is a schematic diagram showing a display device according to an embodiment of the present disclosure; display device.

As shown in FIG. 18, the present disclosure further discloses a display device 1 including a display panel 10 as described above. The display device may be any one of mobile phones, tablet computers, televisions, displayers, laptops, digital photo frames, navigators and any other product or components with a display function. The implement of the display device may refer to the embodiment of the liquid crystal display panel, which is not described again here.

The various embodiments of the present specification are illustrated in a progressive manner, and differences between each subsequent embodiment and the previous embodiments are focused on, but similar parts between the various embodiments may be refer to each other.

The present disclosure may be implemented and used according to above description of embodiments of the present disclosure by the skilled person in the art. It is apparent that various modifications of the embodiments may be made by the person skilled in the art. The general principle defined herein may be applicable in other embodiments without departing from the spirit and scope of the present disclosure. Therefore, the present disclosure will not be limited to the embodiments of the present disclosure and confirms to a widest scope in accordance with the disclosed principle and the novelty features of the present disclosure.

What is claimed is:

1. A thin-film-transistor (TFT) array substrate comprising:
a base;
a display region disposed on the base; and
a gate drive circuit region disposed on the base and in a peripheral region around the display region,
wherein the display region comprises:
a plurality of data lines extending along a first direction, and
a plurality of scan lines extending along a second direction, the scan lines intersecting and electrically insulated from the data lines,
wherein the gate drive circuit region comprises:
at least one first capacitor having two electrode plates,
a plurality of TFTs which are separated from each other to form a margin region between source/drain electrodes of adjacent TFTs thereof, and
a first dielectric layer disposed on the source/drain electrodes of the TFTs and in the margin region,
wherein the at least one first capacitor is disposed on the first dielectric layer in the margin region in a plane view,
the margin region comprises gaps formed between the source/drain electrode of adjacent TFTs, and
patterns of the electrode plates of the first capacitor are formed above the gaps at a level higher than that of the adjacent TFTs.

2. The TFT array substrate of claim 1, wherein the electrode plates of the first capacitor include a first electrode plate and a second electrode plate disposed opposite to each other, and electrically insulated from each other, wherein an orthogonal projection of the patterns of the first electrode plate and the second electrode plate onto the gaps are at least partially overlapped with the gaps.

3. The TFT array substrate of claim 2, wherein the first electrode plate is electrically connected to a first potential and the second electrode plate is electrically connected to a second potential.

4. The TFT array substrate of claim 3, wherein the gate drive circuit region further comprises:
at least one first wire interconnection structure which exposes a data line metal layer, a scan line metal layer, and the first electrode plate and includes a plurality of through holes and a first connection layer, wherein the first electrode plate is electrically connected to the first potential through a through hole in the first wire interconnection structure.

5. The TFT array substrate of claim 4, wherein the gate drive circuit region further comprises:
at least one second wire interconnection structure which exposes the data line metal layer and the scan line metal layer and includes a plurality of through holes and a second connection layer, wherein the second electrode plate is electrically connected to the second potential through a through hole in the second wire interconnection structure.

6. The TFT array substrate of claim 2, wherein the first dielectric layer is disposed between the first electrode plate and a data line metal layer forming the source/drain electrodes of the TFTs.

7. The TFT array substrate of claim 6, wherein the first dielectric layer comprises a passivation layer or an organic film layer.

8. The TFT array substrate of claim 7, wherein a thickness of the organic film is in a range from 0.8 µm to 5 µm, and a thickness of the passivation layer is in a range from 0.8 µm to 5 µm.

9. The TFT array substrate of claim 2, wherein the display region comprises a first transparent conductive electrode and a second transparent conductive electrode, wherein the first electrode plate comprises the same material as and is disposed in the same layer as the first transparent conductive electrode, and wherein the second electrode plate comprises the same material as and is disposed in the same layer as the second transparent conductive electrode.

10. The TFT array substrate of claim 2, wherein orthographic projections of the first electrode plate and the second electrode plate on the base are not overlapped with a semiconductor layer of the TFT.

11. The TFT array substrate of claim 3, wherein the first capacitor further comprises third electrode plate disposed above and electrically insulated from the second electrode plate.

12. The TFT array substrate of claim 11, wherein the third electrode plate is electrically connected to the first electrode plate, or the third electrode plate is electrically connected to the second electrode plate.

13. The TFT array substrate of claim 11, wherein the first capacitor further comprises a fourth electrode plate disposed above and electrically insulated from the third electrode plate.

14. The TFT array substrate of claim 13, wherein the fourth electrode plate is electrically connected to the first electrode plate, and the third electrode plate is electrically connected to the second electrode plate.

15. The TFT array substrate of claim 13, wherein the fourth electrode plate is electrically connected to the second electrode plate, and the third electrode plate is electrically connected to the first electrode plate.

16. The TFT array substrate of claim 13, wherein patterns of the third electrode plate and the fourth electrode plate are at least partially identical to shapes of the gaps.

17. The TFT array substrate of claim 13, wherein an insulating layer is disposed between one or more adjacent pairs of the first electrode plate, the second electrode plate, the third electrode plate, and the fourth electrode plate.

18. The TFT array substrate of claim 13, wherein the first electrode plate, the second electrode plate, the third electrode plate, and the fourth electrode plate comprise metal material or metal oxide material.

19. A display panel comprising:
a TFT array substrate;
a color filter substrate; and
a display medium layer disposed between the TFT array substrate and the color filter substrate,
wherein the TFT array substrate comprises:
a base;
a display region disposed on the base; and
a gate drive circuit region disposed on the base and in a peripheral region around the display region,
wherein the display region comprises:
a plurality of data lines extending along a first direction, and
a plurality of scan lines extending along a second direction, the scan lines intersecting and electrically insulated from the data lines,
wherein the gate drive circuit region comprises:
at least one first capacitor having two electrode plates,
a plurality of TFTs which are separated from each other to form a margin region between source/drain electrodes of adjacent TFTs thereof, and
a first dielectric layer disposed on the source/drain electrodes of the TFTs and in the margin region,
wherein the at least one first capacitor is disposed on the first dielectric layer in the margin region in a plane view,
the margin region comprises gaps formed between the source/drain electrode of adjacent TFTs, and
patterns of the electrode plates of the first capacitor are formed above the gaps at a level higher than that of the adjacent TFTs.

20. A display device comprising:
a display panel which comprises a display panel comprising:
a TFT array substrate;
a color filter substrate; and
a display medium layer disposed between the TFT array substrate and the color filter substrate,
wherein the TFT array substrate comprises:
a base;
a display region disposed on the base; and
a gate drive circuit region disposed on the base and in a peripheral region around the display region,
wherein the display region comprises:
a plurality of data lines extending along a first direction, and
a plurality of scan lines extending along a second direction, the scan lines intersecting and electrically insulated from the data lines,
wherein the gate drive circuit region comprises:
at least one first capacitor having two electrode plates,
a plurality of TFTs which are separated from each other to form a margin region between source/drain electrodes of adjacent TFTs thereof, and
a first dielectric layer disposed on the source/drain electrodes of the TFTs and in the margin region,
wherein the at least one first capacitor is disposed on the first dielectric layer in the margin region in a plane view,
the margin region comprises gaps formed between the source/drain electrode of adjacent TFTs, and
patterns of the electrode plates of the first capacitor are formed above the gaps at a level higher than that of the adjacent TFTs.

* * * * *